(12) United States Patent
Mandrekar et al.

(10) Patent No.: US 8,114,761 B2
(45) Date of Patent: Feb. 14, 2012

(54) METHOD FOR DOPING NON-PLANAR TRANSISTORS

(75) Inventors: Tushar V. Mandrekar, San Jose, CA (US); Shankar Venkataraman, Santa Clara, CA (US); Zhong Qiang Hua, Saratoga, CA (US); Manuel A. Hernandez, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/843,726

(22) Filed: Jul. 26, 2010

(65) Prior Publication Data

US 2011/0129990 A1 Jun. 2, 2011

Related U.S. Application Data

(60) Provisional application No. 61/265,183, filed on Nov. 30, 2009.

(51) Int. Cl.
*H01L 21/00* (2006.01)

(52) U.S. Cl. ........................................ 438/563; 438/780

(58) Field of Classification Search .......... 438/780–782, 438/558–564

See application file for complete search history.

(56) References Cited

U.S. PATENT DOCUMENTS

| 6,831,292 B2 * | 12/2004 | Currie et al. | 257/19 |
| 7,524,743 B2 * | 4/2009 | Gupta et al. | 438/514 |

OTHER PUBLICATIONS

"Applied Siconi™ Preclean," Applied Materials, Inc., pp. 1-8, printed on Aug. 7, 2009.
"Applied Producer® Harp™," Applied Materials, Inc., pp. 1-3, printed on Aug. 7, 2009.
"Applied Producer® SACVD®," Applied Materials, Inc., pp. 1-4, printed on Aug. 7, 2009.
L.Q. Xia et al., "Subatomospheric Chemical Vapor Deposited Boron-Doped Silicate Glass Films for Solid Phase Diffusion Applications," J. Electrochem. Soc., vol. 144, No. 5, pp. L117-L119, May 1997.
"FinFETs," Wikipedia, p. 1, printed on Mar. 24, 2009.

* cited by examiner

*Primary Examiner* — Richard A. Booth
(74) *Attorney, Agent, or Firm* — Kilpatrick Townsend & Stockton LLP

(57) ABSTRACT

Methods for doping a non-planar structure by forming a conformal doped silicon glass layer on the non-planar structure are disclosed. A substrate having the non-planar structure formed thereon is positioned in chemical vapor deposition process chamber to deposit a conformal SACVD layer of doped glass (e.g. BSG or PSG). The substrate is then exposed to RTP or laser anneal step to diffuse the dopant into the non-planar structure and the doped glass layer is then removed by etching.

10 Claims, 3 Drawing Sheets

METHOD FOR DOPING NON-PLANAR TRANSISTORS

CROSS-REFERENCES TO RELATED APPLICATIONS

This application claims the benefit of U.S. Provisional Patent Application No. 61/265,183, filed Nov. 30, 2009, and entitled "METHOD FOR DOPING NON-PLANAR TRANSISTORS," which is incorporated herein by reference for all purposes.

BACKGROUND OF THE INVENTION

The present invention relates generally to doping non-planar structures such as those formed during the fabrication of some integrated circuits and photovoltaic cells. More particularly, the present invention relates to a method for providing a conformal dopant distribution on a non-planar silicon structure.

A common technique used in fabrication of some semiconductor devices is to dope a silicon substrate with boron and/or phosphorus to adjust the electrical properties of the silicon. There are a variety of techniques used to dope planar structures formed on a silicon substrate including ion implantation, plasma doping and dopant diffusion. As device dimensions are reduced in order to achieve better performance and reduce the manufacturing costs, however, some doping techniques like ion implantation may not be feasible. Ion implantation damages the crystal structure of the silicon due to high energy particle bombardment. This becomes problematic especially in sub-micron dimensions where the device cannot tolerate crystal damage beyond a certain level, and using ion-implantation may result in poor contacts, increased junction leakage and increase in contact resistance. Therefore, with smaller dimension devices, doping techniques such as dopant diffusion techniques that do not compromise the structural integrity of the device may provide better results.

In a dopant diffusion technique, a thin doped layer is deposited over the structure and diffused into the underlying silicon substrate using a thermal anneal process, such as a rapid thermal processing (RTP) technique. Dopant diffusion provides conformal dopant distribution with better controllability than ion implantation. One known dopant diffusion technique that has been used to dope planar silicon structures forms a thin conformal doped silicate glass layer over the planar structure using a form of chemical vapor deposition (CVD) referred to as sub-atmospheric chemical vapor deposition (SACVD). This known SACVD dopant diffusion process combines ozone ($O_3$) with tetraethyl orthosilicate (TEOS) and an appropriate dopant, such as triethylborate (TEB) as a boron source for a BSG film and/or triethylphosphate (TEPO) as a phosphorus for a PSG film) at sub-atmospheric pressure, for example 100-700 torr, and a temperature of between 400-500° C. The deposited doped layer, such as phosphorus silicate glass (PSG) or boron silicate glass (BSG), is then be exposed to an RTP step to thermally drive the dopants into the silicon.

Further scaling of semiconductor devices in modern integrated circuit fabrication techniques have motivated the adoption of non-planar structures in logic, memory and other applications where gate, source and drain are formed above the silicon substrate. FIG. 1 is a simplified perspective view of one such non-planar structure referred to as a Fin Field Effect Transistor (FINFET). As shown in FIG. 1, a FINFET 10 is formed on top of a silicon substrate 12 having a drain 14, a source 16, a gate 18 and a FIN 20. These non-planar features may be formed by depositing and patterning polysilicon over silicon substrate 12 or by etching trenches into the silicon substrate.

Despite the desire of semiconductor manufacturers and others to adopt non-planar structures in both semiconductor devices and solar cells, there are challenges associated with doping the raised patterned silicon structures such as the drain, source and channel of FINFET 10 shown in FIG. 1. The non-planar structures do not have the structural support that planar structures have, and thus their structural form may be damaged during doping, activation and etching. Also, due to the small dimensions and shape of non-planar structures, thermal budget limitations may restrict the ability of device manufacturers to anneal damage induced during the doping process. Accordingly, improved techniques and methods for uniformly doping non-planar structures are desirable.

BRIEF SUMMARY OF THE INVENTION

Embodiments of the invention pertain to methods for doping patterned, non-planar silicon features formed over a substrate. The inventors have found that techniques used to dope silicon in planar structures do not necessarily work or are not ideal for non-planar structures and have thus developed a new and improved technique particularly suited for doping non-planar structures. While embodiments of the invention are particularly suited for doping the source, drain and channel in non-planar structures such as vertical transistors and multi-gate non-planar structures such as FINFETs, embodiments of the invention may also be used to dope any vertical structure including solar cells, vertical transistors in memory devices, deep trench structures in image sensors, among others.

One embodiment of the invention is directed to a method of doping a non-planar structure formed over a substrate. The method comprises positioning the substrate having a non-planar structure formed thereon in a substrate processing chamber, the non-planar structure having raised patterned silicon features formed above a lower surface of the substrate; depositing a doped conformal silicate glass layer over the raised silicon features using an SACVD process at a deposition temperature of equal or less than 350° C.; diffusing dopant from the doped conformal silicate glass layer into the raised patterned silicon features using an RTP or laser annealing process; and removing the doped conformal silicon glass layer from the substrate.

Another embodiment is directed to a method wherein the raised patterned silicon features are part of an integrated circuit and comprise a plurality of trenches that are partially filled with a dense oxide. Another embodiment is directed to a method, wherein the doped conformal silicon glass layer is removed from the substrate by a etching process that is selective to dense oxide.

Another embodiment is directed to a method, wherein the SACVD deposition process for the doped conformal silicon glass layer comprises: vaporizing and transferring TEOS and TEB or TEPO, using Helium as a carrier gas, into a SACVD chamber pressurized as high as 600 Torr, and add with $O_3$, and maintaining the substrate temperature of 200° C.-550° C. during the process; wherein the doped conformal layer of doped silicon having thickness of 6-10 nm is formed on the non-planar structure with the deposition rate up to 2000 Angstrom per minute.

In another embodiment the concentration of the doped conformal silicon glass layer is increased by pre-flowing the TEOS and TEB or TEPO to the SACVD chamber. In one embodiment the substrate is positioned in a cleaning chamber before positioning the substrate in the substrate processing chamber, and wherein the cleaning chamber is configured to remove a native oxide formed on the surface of the substrate. In some embodiments the RTP annealing process comprises positioning the substrate into a RTP chamber, and heating the substrate to 1000-1050° C. for at most 1.5 seconds, wherein the doped conformal glass layer is diffused into the non-planar structure.

These and other embodiments of the invention along with many of its advantages and features are described in more detail in conjunction with the text below and attached figures.

DETAILED DESCRIPTION OF THE INVENTION

Figure 1:
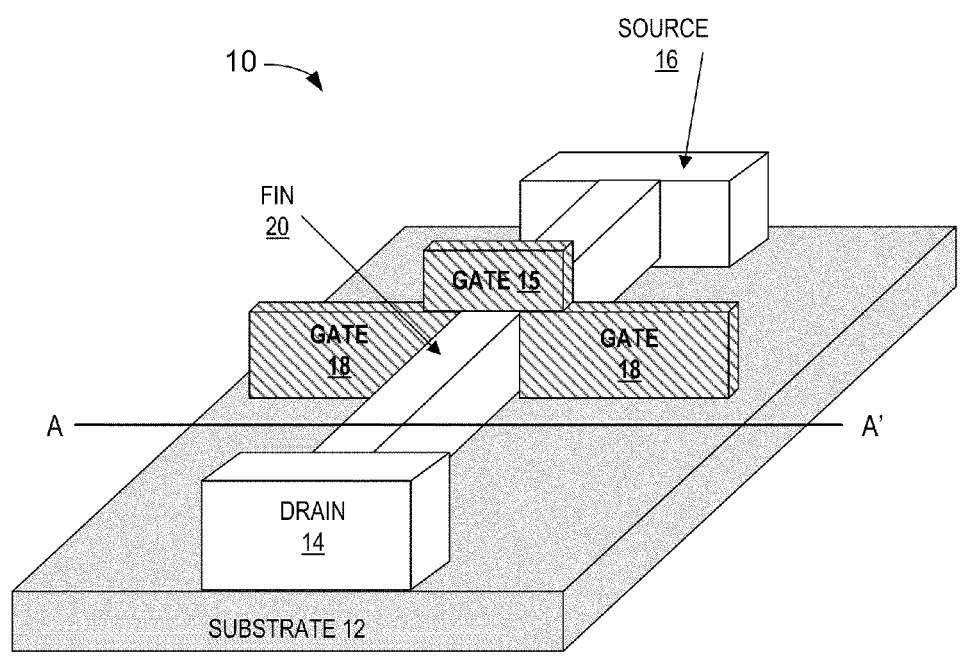
FIG. 1 is a simplified perspective view of a partially formed non-planar FINFET structure 10.

Doping non-planar structures require a degree of controllability that may be greater than what is needed for similarly dimensioned planar structures. For example, for multi-gate structures such as FINFET 10 shown in FIG. 1, uniform doping of the FIN structure helps to achieve Vt uniformity. Achieving this with ion implantation may require ion bombardment at large tilt angles that makes the process expensive and complex. The present inventors have come up with an improved dopant diffusion process that may advantageously be used to dope non-planar structures where doping uniformity and structural integrity is important. One embodiment of the method of the present invention uses a thermally driven SACVD deposition process to deposit a highly conformal sacrificial doped silicate glass layer over the non-planar structure. Deposition conditions are carefully controlled as described below to optimize dopant uniformity in a manner that is particularly well suited for non-planar structures. Then, after the doped layer is deposited, the structure is exposed to a thermal anneal step to drive the dopant into the underling non-planar structure before the sacrificial layer is removed.

Figure 2:
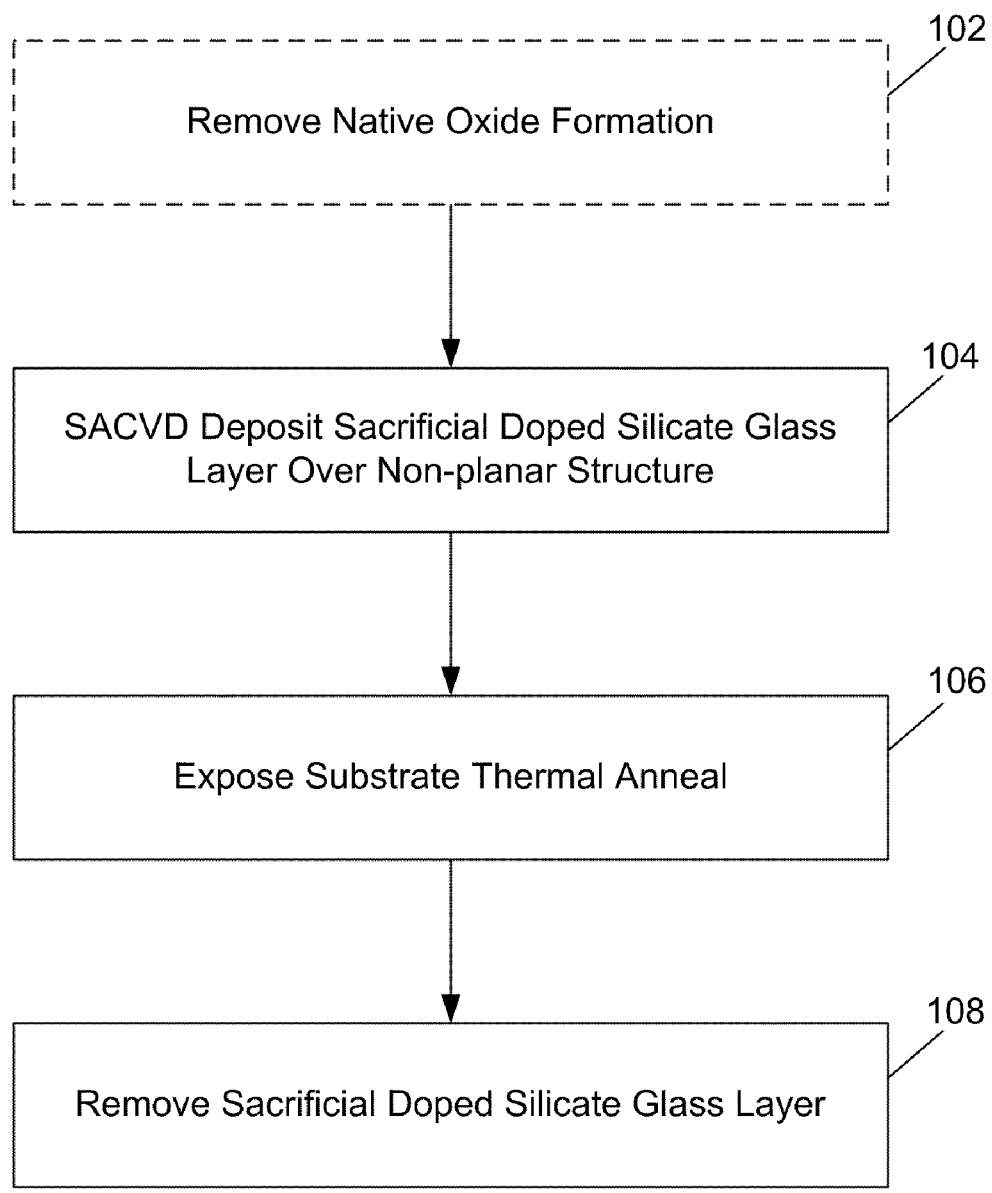
FIG. 2 is a flowchart depicting the steps associated with one embodiment of the present invention.

To better understand and appreciate the invention, reference is made to FIG. 2, which is a flowchart that depicts the steps associated with doping a non-planar structure according to one embodiment of the present invention, along with FIGS. 3A-3E, which are simplified cross-sectional views of a FINFET non-planar structure (taken across lines A-A' of FIG. 1) processed according to the method of the present invention described in FIG. 2.

Figure 3A:
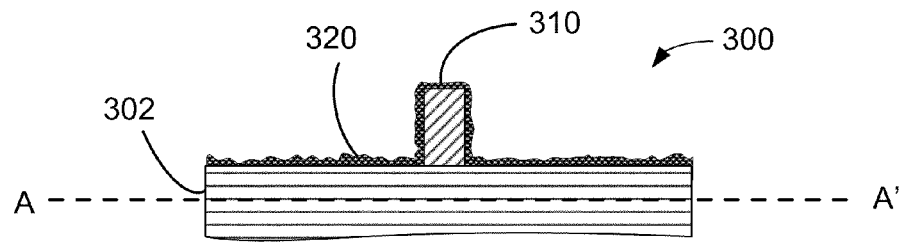
FIGS. 3A-3E are simplified cross-sectional views of non-planar FINFET structure 10 shown in FIG. 1 as it is processed according to the method of the present invention described in FIG. 2 to dope the raised silicon drain, source and gate portions of the FINFET.

Referring first to FIG. 3A, in some instances a native oxide 320 forms over the structure FIN 310 and other portions of structure 300 when, for example, substrate 302 is exposed to the ambient environment within a clean room. Native oxide 320 may impede dopant diffusion from the sacrificial SACVD layer into the underlying silicon and reduce the uniformity and concentration level needed after the deposition process. Therefore, as an optional step, some embodiments of the invention remove any native oxide formations 320 that may have formed over the non-planar structure (step 102) prior to depositing the sacrificial SACVD layer.

Figure 3B:
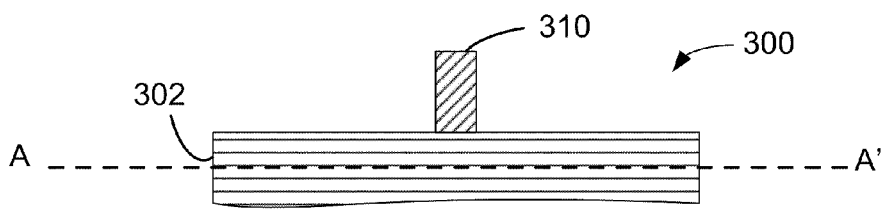

In one particular embodiment the oxide removal process is a Siconi™ Preclean step performed in a Siconi™ Preclean available from Applied Materials, the assignee of the present invention, that removes native oxide through a low-temperature, two-step dry chemical clean process. The first step in the Siconi™ Preclean process uses a remote plasma source to generate ammonium fluoride ($NH_4F$) etchant species from nitrogen trifluoride ($NF_3$) and ammonia ($NH_3$) to minimize the damage to the substrate. The etchant species are introduced into the preclean chamber and condensed into a solid by-product on the cooled wafer surface through a reaction with native oxide. In the second step, an in-situ anneal is performed to decompose the by-product using convection and radiation heating. As the residue sublimates, it is removed by radial gas flow from the wafer surface and pumped out of the chamber, leaving behind a clean wafer ready for deposition. Other embodiments of the invention may use other oxide removal techniques to remove native oxide formations. FIG. 3B shows FINFET 300 after native oxide formation 320 was removed.

Figure 3C:
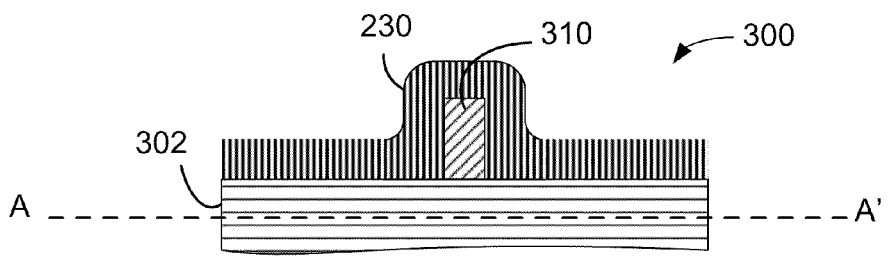

After the optional oxide removal process, substrate 302 is then positioned in a deposition chamber where a sacrificial layer 330 of doped silicate glass is deposited over the non-planar structure (step 104) as shown in FIG. 3C. Because structure 300 is non-planar, deposition of layer 330 needs to conform to the underlying shape of the structure. That is, for dopant to be uniformly diffused into both the horizontal and vertical surfaces of silicon FIN 310, layer 330 should be a highly conformal layer that has uniform dopant characteristics along both the horizontal and vertical portions of the layer. Embodiments of the invention optimize the deposition conditions of layer 330 by, among other steps, lowering its deposition temperature to more precisely control the deposition rate and thickness of the deposited film and adjusting flow rates of the dopant to provide a relatively high concentration of dopant within layer 330 compared to a typical dopant concentration used in planar applications.

In one embodiment, the deposition process is performed at a low deposition rate of about 200-400 Angstroms per minute by maintaining the temperature less than 350° C. Deposition rates within this range enable the control of the deposition process with greater precision thus providing the capability to deposit a very thin uniform film about 6-10 nm thick. During deposition pressure within the chamber is set to between 100 and 600 Torr. Gas flow ranges are about 20 liters to 80 liters of total gas including ozone, nitrogen, oxygen, helium, TEPO, TEB, and TEOS but not limited to this range. In one embodiment, a relatively high dopant concentration of about 10-12% is deposited on the non-planar structure which will result in a lower threshold voltage $V_t$ of the non-planar structure and thereby increase the device speed.

In the SACVD chamber liquid TEOS and a dopant source are vaporized and transferred into the chamber using a carrier gas such as Helium (He) and mixed with $O_3$. This resulting reaction forms a conformal doped silicate glass layer over the non-planar film. Example dopant sources include triethyl borate (TEB) for a boron-doped silicate glass layer (BSG) and triethyl phosphate TEPO for a phosphorus-doped silicate glass (PSG) layer.

In some embodiments, certain regions of the non-planar structure may be masked with a resist or an oxide film prior to the deposition of layer 330 to control the doping location and create aligned source, drain and channel region. In other embodiments, a Siconi™ etch step may be used to shape the edge of the underlying masking oxide to shape the distribution of dopant at the edges.

In one embodiment, the SACVD chamber and Siconi™ chamber may reside on the same mainframe where the Siconi™ removes the native oxide from a non-planar structure and then the silicon wafer is transferred to the SACVD chamber under vacuum conditions for deposition of the BSG film and/or PSG film.

In some embodiments, the dopant concentration may be increased by pre-flowing the dopant into the SACVD chamber. For example, in some embodiments it is desirable to have higher surface dopant concentrations to further improve the doping level in the silicon and to allow modulation of the junction dopant profile. Some embodiments of the invention introduce a flow of the dopant source with or without ozone for up to 120 seconds prior to introducing the ozone and TEOS sources.

Figure 3D:
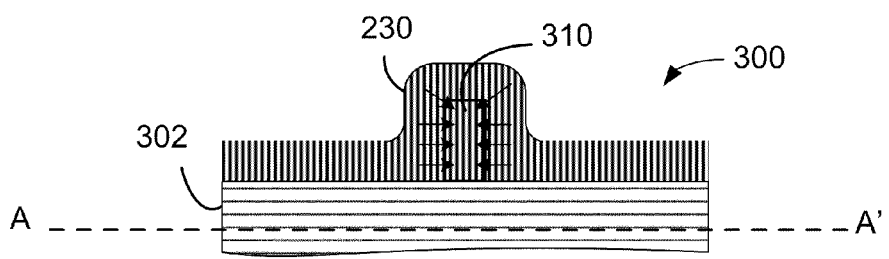

After the deposition of dopant layer 330, the substrate is exposed to a thermal anneal process, such as an RTP anneal (step 106). During the RTP step the substrate is irradiated with a radiant heat source powerful enough to quickly raise the temperature of the substrate to the desired process temperature and hold it at that temperature for a sufficient period of time to accomplish a specific process step. FIG. 3D shows the annealing of FIN 310 of the FINFET during the RTP anneal process in which the dopants are diffused into the FIN structure resulting in a uniformly doped FIN structure 310. In one embodiment, the RTP temperature may be between 800° C. and 1200° C. for 1.5 seconds or less. This allows the diffusion process to occur without changing the shape of the FIN structure. In some embodiments, other appropriate annealing methods, such as laser annealing also known as dynamic surface annealing (DSA) or conventional furnace annealing, may be used instead of RTP for solid state diffusion of dopants into the non-planar structure. In laser annealing, a pulsed laser beam is concentrated on the non-planar structure which heats the structure. The laser anneal provides the needed temperature in a shorter time. Both RTP anneal and laser anneal provide the capability of controlling the depth of the dopant as it is diffused into the substrate or a non-planar structure.

Figure 3E:
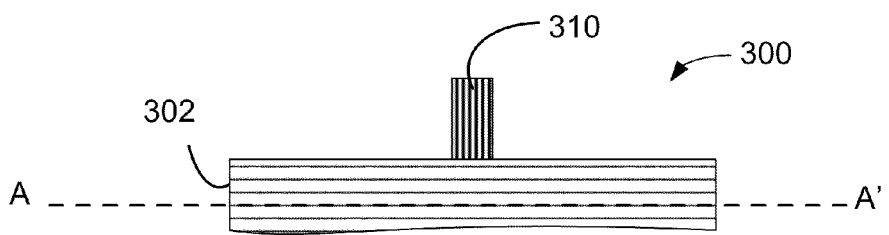

After the anneal step, the sacrificial layer is removed with an appropriate etchant (e.g., by using any one of hydrofluoric acid (HF), ammonium hydroxide ($NH_4OH$) or SC-1 ($NH_4OH:H_2O_2:H_2O$)) (step 108) resulting in the structure shown in FIG. 3E. The etching process is selective to silicon, and in embodiments where the doped layer is deposited over a dense oxide, such as a thermal oxide, a HARP (High Aspect Ratio Process) oxide and/or eHARP oxide is selective to those dense oxides as well. In one embodiment, Siconi™ may be used to remove the oxide (PSG or BSG film). High selectivity of PSG and BSG allows for removal using multiple etchants, or by using the Siconi™, or the combination of Siconi™ and an etchant.

Having fully described several embodiments of the present invention, many other equivalents or alternative embodiments of the present invention will be apparent to those skilled in the art. Also, while the embodiments are described with reference to a non-planar transistor, other non-planar structures such as solar cells may also be doped with this method. As such, the above description is illustrative and not restrictive. These equivalents and/or alternatives are intended to be included within the scope of the present invention.

What is claimed is:

1. A method of doping a non-planar structure formed over a substrate, the method comprising:

positioning the substrate having a non-planar structure formed thereon in a substrate processing chamber, the non-planar structure having raised patterned silicon features formed above a lower surface of the substrate;

depositing a doped conformal silicate glass layer over the raised silicon features using an SACVD process at a deposition rate of between 200-400 Angstroms per minute ° C.; diffusing dopant from the doped conformal silicate glass layer into the raised patterned silicon features using an RTP or laser annealing process;

and removing the doped conformal silicon glass layer from the substrate.

2. The method of claim 1, wherein the raised patterned silicon features are part of an integrated circuit and comprise a plurality of trenches that are partially filled with a dense oxide.

3. The method of claim 1, wherein the doped conformal silicon glass layer is removed from the substrate by a etching process that is selective to dense oxide.

4. The method of claim 1, wherein the SACVD deposition process for the doped conformal silicon glass layer comprises:

vaporizing and transferring TEOS and TEB or TEPO, using Helium and/or Nitrogen as carrier gas, into a SACVD chamber pressurized to 100-600 Torr, and adding with $O_3$ 10-20 Lpm.

5. The method of claim 4, wherein concentration of the doped conformal silicon glass layer is increased by pre-flowing the TEOS and TEB or TEPO to the SACVD chamber.

6. The method of claim 1, wherein the substrate is positioned in a cleaning chamber before positioning the substrate in the substrate processing chamber, and wherein the cleaning chamber is configured to remove a native oxide formed on the surface of the substrate.

7. The method of claim 1, wherein the RTP annealing process comprises:

positioning the substrate into a RTP chamber, and heating the substrate to 1000-1050° C. for at most 1.5 seconds, wherein the doped conformal glass layer is diffused into the non-planar structure.

8. The method of claim 1 wherein the doped conformal silicate glass layer is deposited at a temperature of less than 350 degrees Celsius.

9. A method of doping a non-planar structure formed over a substrate, the method comprising:

positioning the substrate having a non-planar structure formed thereon in a substrate processing chamber, the non-planar structure having raised patterned silicon features formed above a lower surface of the substrate;

depositing a conformal silicate glass layer doped with boron or phosphorus over the raised silicon features using a thermally driven SACVD process at a deposition temperature of less than 350° C., a pressure of between 100-600 Torr, and a deposition rate of between 200-400 Angstroms per minute;

diffusing dopant from the doped conformal silicate glass layer into the raised patterned silicon features using an RTP process;

and removing the doped conformal silicon glass layer from the substrate.

10. The method of claim 9 wherein the doped conformal silicate glass layer has a dopant concentration of between 10-12 percent.

* * * * *